United States Patent
Campbell

[11] Patent Number: 6,122,081
[45] Date of Patent: Sep. 19, 2000

[54] USING THE TALBOT EFFECT FOR LENSLESS IMAGING OF PERIODIC STRUCTURES IN A HOLOGRAPHIC MEMORY SYSTEM

[75] Inventor: Scott Patrick Campbell, Pasadena, Calif.

[73] Assignee: Lucent Technologies Inc., Murray Hill, N.J.

[21] Appl. No.: 09/378,129

[22] Filed: Aug. 18, 1999

[51] Int. Cl.[7] .............................. G02B 1/26; G02B 1/28; G11C 13/04

[52] U.S. Cl. .................. 359/22; 359/24; 359/29; 359/30; 359/569; 365/125; 365/216; 369/103

[58] Field of Search .................. 359/22, 24, 29, 359/30, 566, 569; 365/125, 216; 369/103, 109

[56] References Cited

U.S. PATENT DOCUMENTS

| | | |
|---|---|---|
| 4,034,355 | 7/1977 | Carlsen .......................... 340/173 LM |
| 4,813,762 | 3/1989 | Leger et al. ........................ 350/162.16 |
| 5,359,193 | 10/1994 | Nyui et al. ........................... 250/237 G |
| 5,617,227 | 4/1997 | De Bougrenet De La Tocnaye et al. ........................................................................ 359/569 |
| 5,822,263 | 10/1998 | Campbell et al. ....................... 365/216 |
| 5,859,808 | 1/1999 | Campbell et al. ....................... 365/216 |

*Primary Examiner*—Jon Henry
*Attorney, Agent, or Firm*—Darby & Darby

[57] ABSTRACT

A holographic memory system which utilizes the Talbot Effect for the lensless, near-field propagation of repeating image planes of periodic structures. Periodic phase structures at one plane in a holographic memory system are mapped to the input amplitude data plane in the holographic memory system. In a preferred embodiment, coherent light is passed through a lenslet array and propagated via the Talbot Effect to self-image coincident on a spatial light modulator that provides the holographic memory system with input data. The lenslet array is located relative to the spatial light modulator such that the desirable phase image structure is self-imaged in its Fresnel region onto the input amplitude data structure.

5 Claims, 5 Drawing Sheets

USING THE TALBOT EFFECT FOR LENSLESS IMAGING OF PERIODIC STRUCTURES IN A HOLOGRAPHIC MEMORY SYSTEM

BACKGROUND

1. Field of the Invention

The present invention relates generally to optical memory, and more particularly, to holographic memory which utilizes the Talbot Effect for lensless imaging of periodic structures to map periodic phase structures at one plane in a holographic memory system to the input data plane in the system by propagating a lenslet array to self-image coincident on a spatial light modulator which provides the holographic memory system with input data.

2. Description of the Prior Art

Holographic memory systems store vast amounts of data. This may be useful for archival, read-only applications, or in an active memory system. The basic principle behind these systems involves arranging data in pages, which are rectangular images, and recording these pages on holograms. When the data is to be retrieved, the appropriate page is reconstructed from the hologram.

Most modern processing systems, including personal computers (PCS), rely on one form or another of optical data storage. For example, CD-ROM drives are now standard equipment on nearly all new PCS. Nearly all multimedia software, including video games, maps, encyclopedias, and the like, are sold on CD-ROM. Also, compact discs are the most prevalent storage medium for musical recording. More recently, digital video disc (DVD) technology has been introduced that will expand the storage capacity of standard CD technology from about one-half gigabyte to about five gigabytes.

The large storage capacities and relatively low costs of CD-ROMs and DVDs have created an even greater demand for still larger and cheaper optical storage media. Many large businesses rely on jukebox-style CD changers in order to access a particular one of potentially hundreds of discs. Motion pictures released in optical storage format still require multiple CDS, DVDs or oversized laser discs. However, it appears that the limits of CD-ROM and DVD technology are being reached. In order to continue to improve the capacity and speed of optical storage systems, research increasingly focuses on holographic storage devices capable of storing hundreds of gigabytes in a CD-sized storage medium.

A number of holographic data storage systems have been developed that are capable of storing and retrieving an entire page of data at a time. In these systems, data to be stored is first encoded in a two dimensional (2D) optical array, for example on a liquid crystal display (LCD) screen, which is one type of spatial light modulator (SLM). Another type of SLM is Texas Instruments' Digital Mirror Device, which is a reflective device that allows the reflectivity of each pixel to be changed. The term "SLM" also includes fixed masks of varying optical density, phase, or reflectivity.

A first laser beam, a plane wave, is transmitted through the SLM and picks up an intensity and/or phase pattern from the data squares and rectangles (pixels) in the 2D array. This data-encoded beam, called an object beam, is ultimately projected onto and into a light-sensitive material, called a holographic memory cell (HMC). A second laser beam, called a reference beam, is also projected onto and into the holographic memory cell. The object beam and the reference beam then cross at the HMC to produce an interference pattern throughout a volume element of the HMC. This unique interference pattern induces material alterations in the HMC that generate a hologram.

The formation of the hologram in the holographic memory cell is a function of the relative amplitudes and polarization states of, and the phase differences between, the object beam and the reference beam. It is also highly dependent on the incident angles at which the object beam and the reference beam were projected onto the holographic memory cell. After hologram storage, the data beam may be reconstructed by projecting into the HMC a reference beam that is the same as the reference beam that produced the hologram. The hologram and the reference beam then interact to reproduce the data-encoded object beam, which may then be projected onto a two-dimensional array of light sensitive detectors which read back the data by sensing the pattern of light and dark pixels.

In holographic memory systems, it is often advantageous to phase encode the input amplitude data structure. Such phase encoding redistributes the amplitude data structure's Fourier transform pattern into a distribution that is better suited for holographic memory systems. However, the selected phase encoding structure must be made optically coincident with the amplitude encoding structure for optimal performance. Such coincidence is generally achieved by four-f imaging the phase structure onto the amplitude structure, or vice versa. The addition of a complete four-f imaging system in order to accomplish such coincidence has inherent drawbacks in system size, cost, complexity, and weight.

Of the infinite choices for such phase encoding structures, some could be periodic in nature. While it is often undesirable to utilize most periodic phase structures in holographic memory systems (because doing so results in little benefit in the Fourier plane restructuring), some may be desirable. One class of periodic phase structures that could be advantageous to use in phase altering the amplitude pattern of the input data set in a holographic memory system is a lenslet array. Use of a lenslet array acts to collapse the higher Fourier order energy into the zero order, while dispersing the D.C. part of the orders locally.

U.S. Pat. No. 5,859,808, assigned to the assignee of the present application, discloses Systems and methods for steering an optical path to gain access to data locations in a holographic memory cell. One of the systems includes: (1) a refractive element that receives a complex, spatially-modulated incident beam of light, (2) first and second reflective elements locatable to receive and reflect the incident beam in a Fresnel region thereof and (3) a reflective element steering mechanism, coupled to the first and second reflective elements, that moves the first and second reflective elements in tandem to steer the incident beam with respect to the HMC thereby to cause the incident beam to illuminate a location on the HMC that is a function of a movement of the first and second reflective elements.

U.S. Pat. No. 4,813,762 entitled "Coherent Beam Combining of Lasers Using Microlenses and Diffractive Coupling" discloses a diffractive lenslet Array which receives light from multiple lasers. The lenslet array is spaced apart from a partially reflecting mirror by a distance $Z=nd^2/\lambda$, where n is an integer or half integer, $\lambda$ is the laser wavelength and d is the spacing of the lenslets in the array. In a preferred embodiment of the '762 Patent, the apparatus is a unitary design in which the lenslets are etched into one surface of a substrate and a parallel surface is coated to form the partially reflecting mirror. The lenslets abut one another to produce a fill factor (percentage of array containing light) close to one and each of the lenslets is a multi step diffractive lens. Diffractive spreading over a round trip distance from lasers to mirror and back again causes feedback light from a single lenslet to couple into adjacent lenslets. The light from all the lenslets is coupled back into the laser waveguides efficiently only when the wave front at each of the lenslets is flat, that is, when the phase of the feedback is uniform across a lenslet. Uniformity is achieved when the separation between lenslet array and mirror is the Talbot self-imaging condition set forth above.

SUMMARY OF THE INVENTION

It is an object of the present invention to utilize the Talbot Effect for the lensless, near-field propagation of repeating image planes of periodic structures.

It is another object of the present invention to use the Talbot Effect to map periodic phase structures at one plane in a holographic memory system to the input data plane in that holographic memory system.

It is another object of the present invention to utilize a lenslet array through which light will be propagated via the Talbot Effect to self-image coincident on the spatial light modulator that provides the holographic memory system with its input data.

It is yet another object of the present invention to provide a holographic memory system in which a periodic phase structure is self-imaged into its Fresnel region onto the input amplitude data structure of a holographic memory system without the need for additional four-f optics.

It is another object of the present invention to employ the Talbot Effect for lensless imaging of periodic structures to map periodic phase structures at one plane in a holographic memory system to the input data plane in the system by propagating a lenslet array to self-image coincident on a spatial light modulator which provides the holographic memory system with input data.

It is yet another object of the present invention to provide a method for lensless imaging of periodic structures to map periodic phase structures at one plane in a holographic memory system to the input data plane in the system by propagating a lenslet array to self-image coincident on a spatial light modulator which provides the holographic memory system with input data.

In accordance with the above objects and additional objects that will become apparent hereinafter, the present invention provides, in a holographic memory system having a holographic memory cell, an apparatus for using the Talbot Effect to map periodic phase structures at one plane to the input data plane in a holographic memory system, comprising: a periodic phase structure (e.g., a lenslet array) having a periodicity 2w for receiving light; an amplitude data structure disposed a distance T from the periodic phase structure such that the phase structure is self-imaged in a Fresnel region of the phase structure into the amplitude data structure, wherein:

$$T = \frac{2mw}{\tan\theta_m}$$

and wherein:

$$\theta_m = \sin^{-1}\left(\frac{[m+1/2]\lambda}{w}\right)$$

when the lenslets of pitch width "w" are illuminated with light at wavelength $\lambda$ and $\theta_m$ is the angle at which the light is diffracted.

The present invention also provides a method of using the Talbot Effect to map periodic phase structures at one plane to the input data plane in a holographic memory system in a holographic memory system having a holographic memory cell, comprising the steps of:

(a) providing a periodic phase structure having a periodicity of 2w for receiving light;

(b) locating an amplitude data structure a distance T from the periodic phase structure such that the phase structure is self-imaged in a Fresnel region of the phase structure into the amplitude data structure in accordance with the above formula; and (c) illuminating the periodic elements of pitch width "w" with light at wavelength $\lambda$, where $\theta_m$ is the angle at which the light is diffracted.

DETAILED DESCRIPTION OF THE PREFERRED EMBODIMENT

The present invention provides a method which avoids the need for an additional four-f imaging system to bring a periodic phase structure plane and an amplitude structure plane into coincidence. This method relies on the Talbot Effect, an interference effect that automatically and continually re-images a periodic structure (amplitude, phase, or some combination thereof) in the structure's Fresnel (near-field) region. Using the Talbot Effect, desirable periodic phase structure (e.g., a lenslet array) is self-imaged in its Fresnel region onto the input amplitude data structure of a holographic memory system without the need for additional (four-f) optics. This self-imaging distance can be microns to meters.

Figure 1:
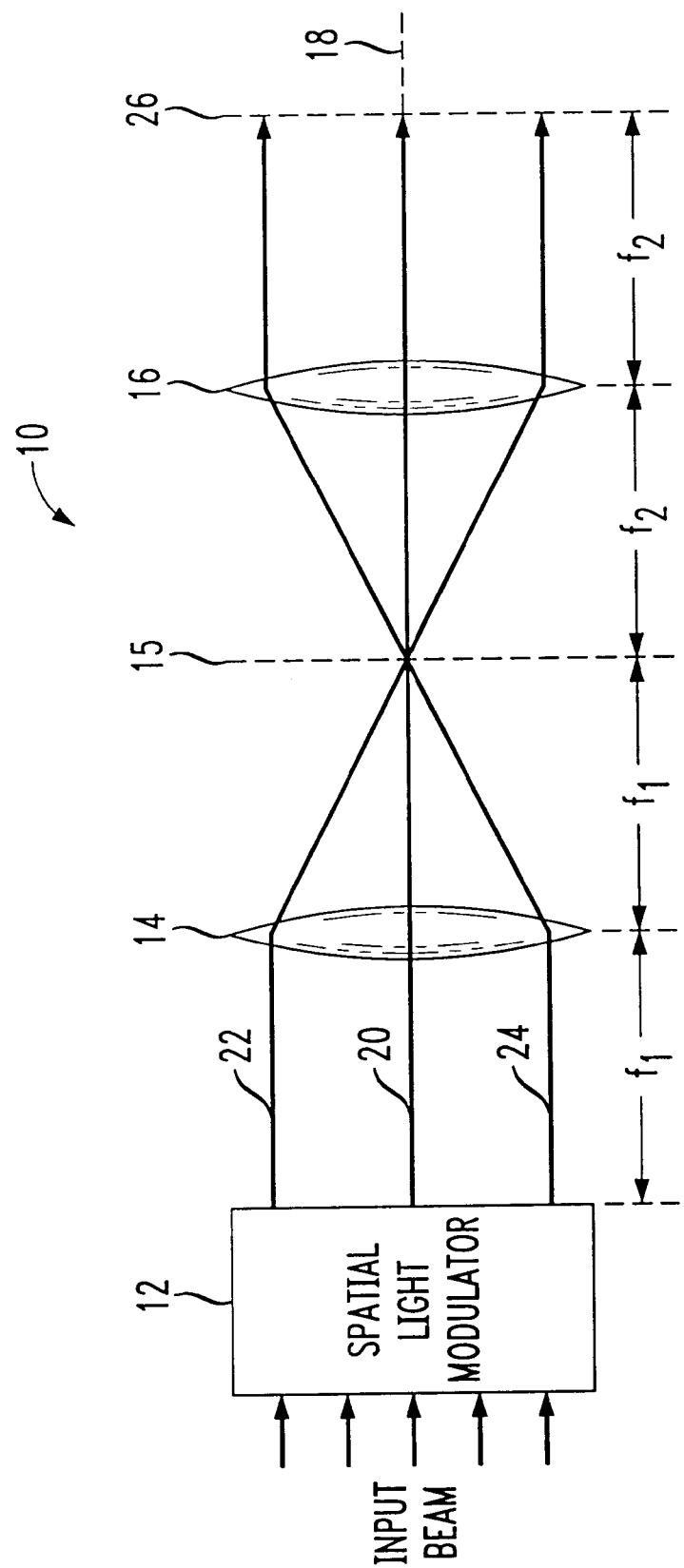
FIG. 1 is a schematic of a conventional four-f imaging system.

FIG. 1 illustrates a conventional four f("4-f") imaging system 10. The configuration of 4-f imaging system 10 shown in FIG. 1 is referred to as "infinite conjugate." The exemplary 4-f imaging system 10 comprises a spatial light modulator (SLM) 12, thin convex lens 14, which has a focal length, $f_1$, and thin convex lens 16, which has a focal length, $f_2$, where $f_1$ and $f_2$ may or may not be equal. SLM 12 comprises, for example, a liquid crystal display (LCD) screen on which data is encoded in a 2D-array pattern of transparent and opaque pixels. SLM 12, lens 14 and lens 16 are positioned orthogonally to optical path 18, shown as a dotted line coincident with solid line 20. A plane wave object beam of coherent laser light is projected through SLM 12, picks up the encoded data pattern, and propagates distance $f_1$ to reach lens 14. The object beam, represented by light beams 20, 22 and 24, passes through lens 14 and propagates distance $f_1$ again to reach Fourier plane 15. At Fourier plane 15, all of the object beam's positional information becomes angular information and all of the object beam's angular information becomes positional information. The image formed at Fourier plane 15 is the input object for lens 16. From Fourier plane 14, the object beam propagates distance $f_2$ to reach lens 16. After passing through lens 16, the object beam finally propagates distance $f_2$ to reach output image plane 26, where the input data image at SLM 12 is reconstructed. Output image plane 26 is the Fourier plane for plane 14, as well as the output image plane for the plane in which SLM 12 lies. Thus, the image formed at output image plane 26 by lens 16 is the Fourier image of the Fourier image formed at Fourier plane 15 by lens 14.

As light beams 20–24 show, the input data image formed at output image plane 26 is inverted with respect to its appearance at SLM 12. Therefore, if a holographic memory cell was positioned at output image plane 26, the inverted image of the 2D-array pattern at SLM 12 would be stored as a page of data in the holographic memory cell. A separate reference beam of laser light (not shown) would be required in order to store the data image. In alternate embodiments of the above-described optical systems, the spatial light modulator may be positioned between the initial lens and the following Fourier plane. An object beam that is incident to the initial lens will be converged by the initial lens, but will pick up the encoded data from the SLM after, rather than before, the initial lens. In such a configuration, the size (positions) of the Fourier orders vary linearly with the distance between the SLM and the following Fourier plane. Additionally, the incident angles of the beams will vary according to the position of the SLM. If lensless steering is desired, then Fresnel region steering can be utilized. The Fresnel region is the region between a lens and the following Fourier focal plane or image focal plane located one focal length, f, away from the lens. In Fresnel region steering, two movable mirrors are placed between one of the lenses in an optical system and the corresponding following Fourier or image focal plane. Advantageously, no additional optics (i.e., lenses) are needed after the pair of moving mirrors in order to complete the steering process.

Figure 2:
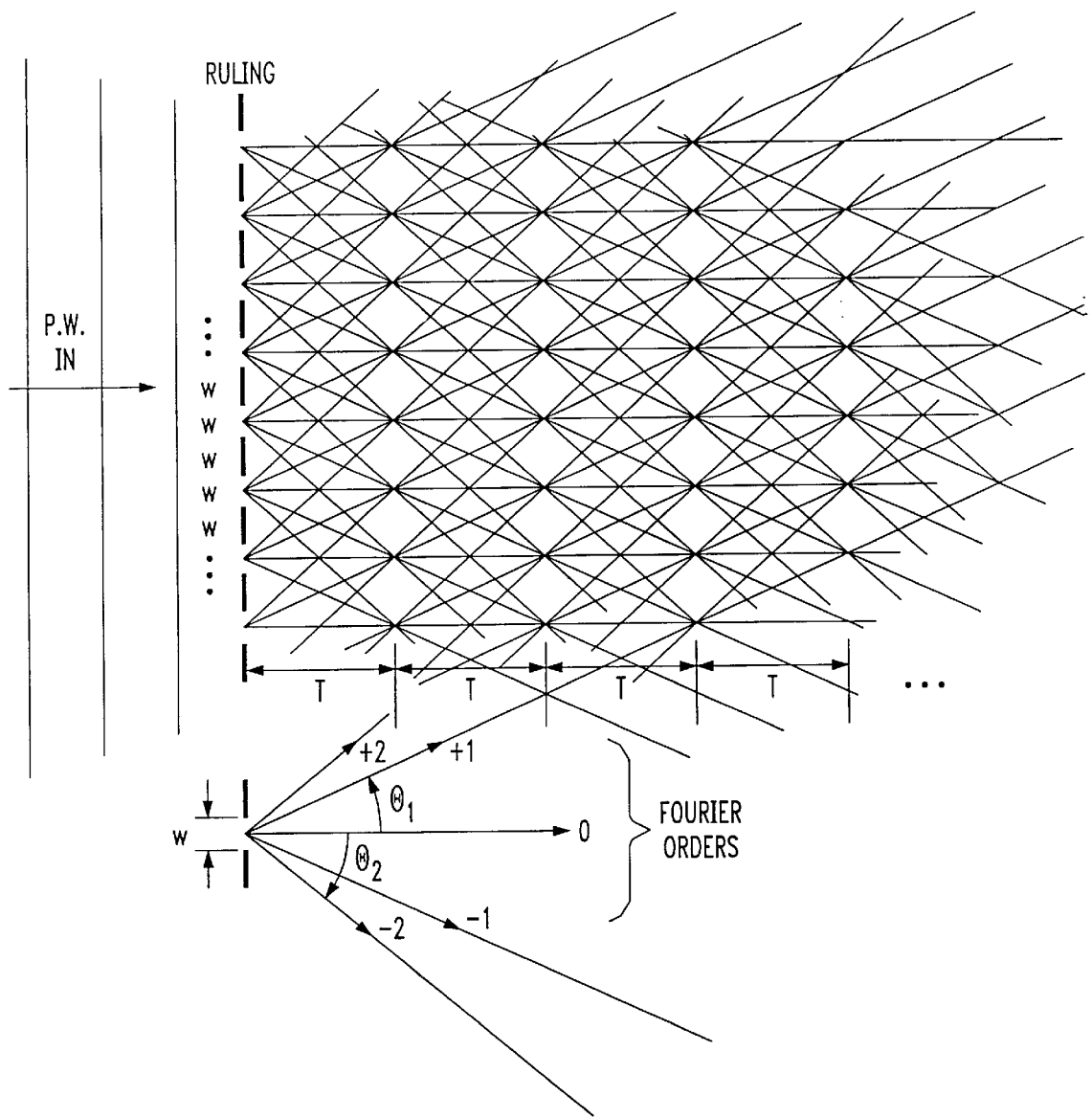
FIG. 2 is a schematic diagram of an amplitude ruling which is illuminated by a plane wave of coherent light.

The Talbot Effect is most easily explained using the example of an amplitude ruling (a periodic set of opaque and clear lines of equal widths, periodicity=2w). Referring to FIG. 2, there is depicted a ruling of pitch width 2w being illuminated with a plane wave of coherent light. As the light propagates through the ruling, it diffracts into the ruling's Fourier components (zero order, +-first order, +- second order, and so on). As each of these diffracted beams propagates, it soon intersects various other similar beams. When the ensemble of beam intersection is observed, it can be seen that there exist discrete planes (Talbot planes) at which the diffraction pattern at the initial ruling is repeated exactly for all regions (except the very outermost, where the limited aperture of the original ruling failed to produce diffracting beams due to their non-existence).

Figure 3:
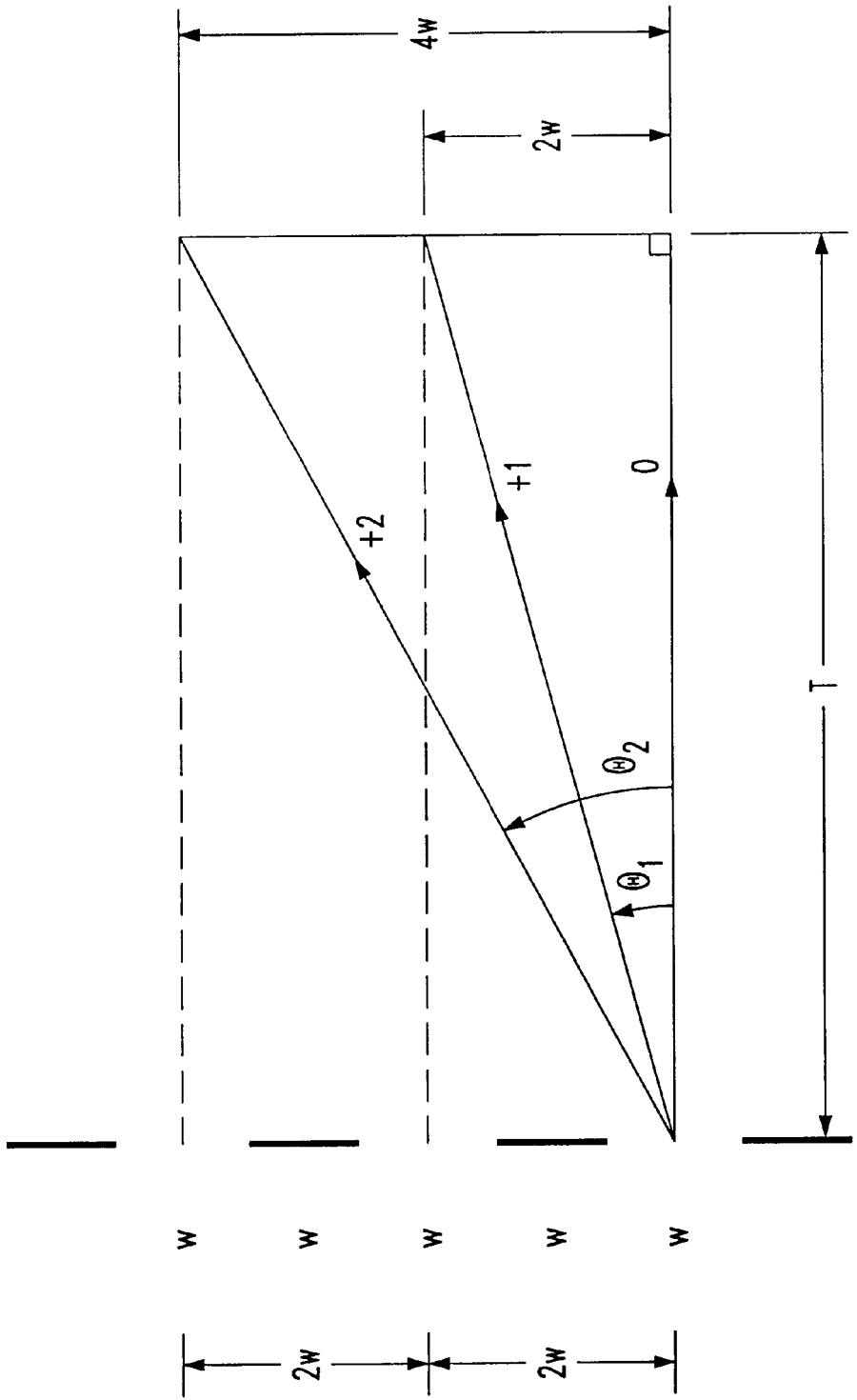
FIG. 3 is a schematic diagram which depicts the resolution of the formula for determining "T"

The spacing between successive Talbot planes, T, is determined by considering the angle $\theta_m$ at which beams are diffracted from the periodic structure under illumination. In the simplest geometric approximation, constructive interference of the beams diffracted from a ruling with line width "w" (periodicity 2w), illuminated with light at wavelength $\lambda$, occurs at angles.

$$\theta_m = \sin^{-1}\left(\frac{[m+1/2]\lambda}{w}\right)$$

for m being the order of the diffraction (not counting the zero order, which emits in the same direction as the incident light). As shown in FIG. 3, T can then be solved for as:

$$T = \frac{2mw}{\tan\theta_m}$$

For example, using visible light at $\lambda$=0.5 microns, and a ruling line width of w =5 microns, $\theta_1$=8.63 degrees, and T=65.9 microns. Thus, approximately every 66 microns the image of this ruling repeats itself.

The Talbot Effect has been extended into general periodic structures as well as periodic amplitude ruling structures. In fact, it has even been studied for lenslet arrays (e.g., periodic, two-dimensional quadratic phase structure arrays). The great benefit of this application for holographic memory systems is that such lenslet arrays can now be placed shortly before an amplitude data encoding device in the object beam's optical path, such that the amplitude data structure sets in one of the Talbot planes of the periodic phase structure. This eliminates the need for four-f imaging of the periodic phase structure onto the amplitude data structure, thereby saving cost and reducing, complexity, size, and weight.

Figure 4A:
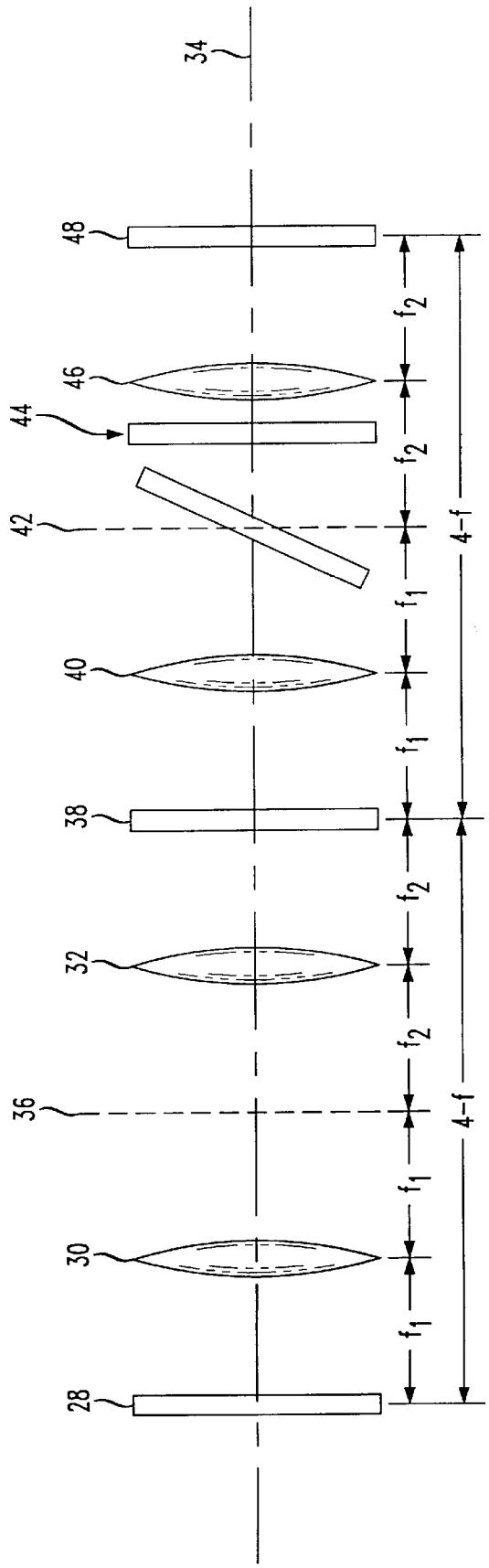
FIG. 4a is a schematic diagram of a prior art conventional imaging technique.
Figure 4B:
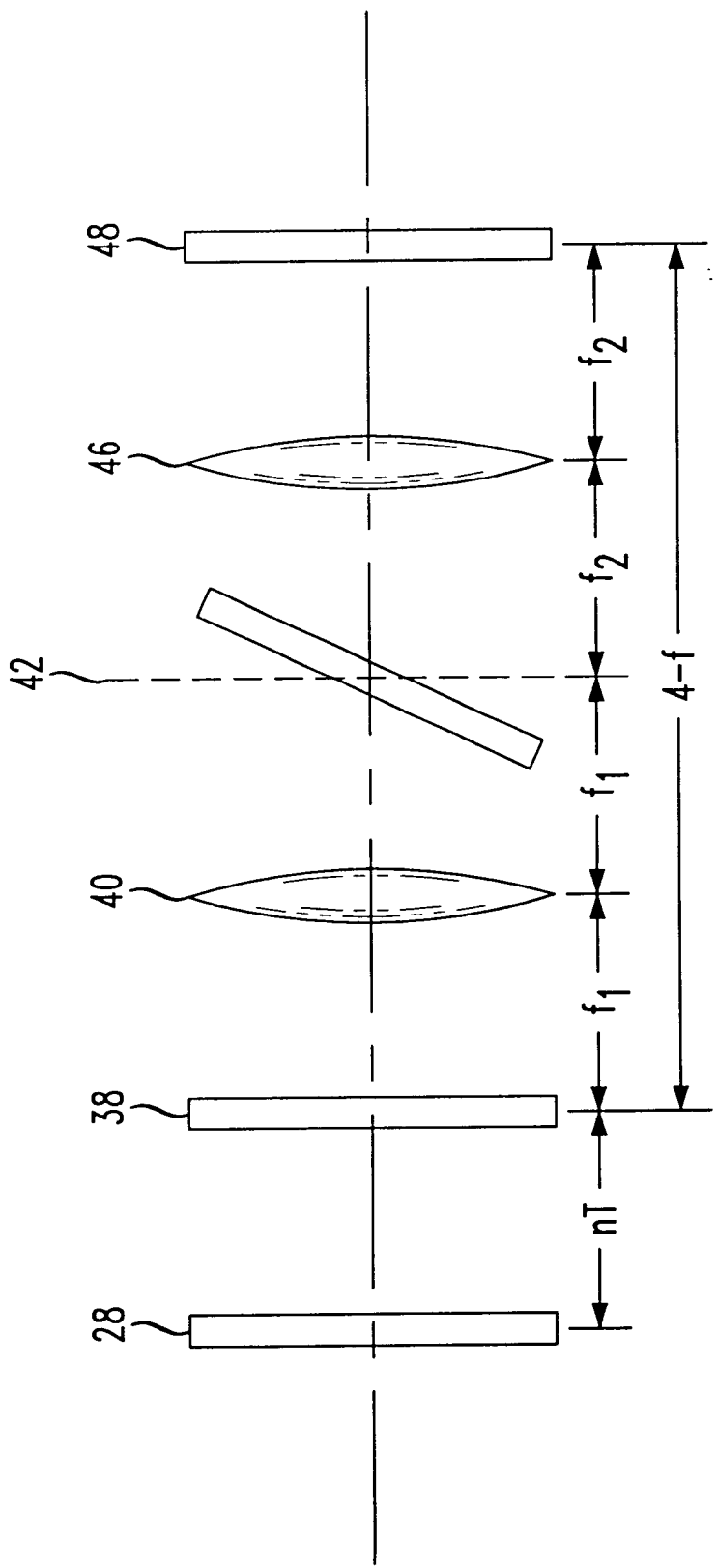
FIG. 4b is a schematic diagram of an imaging technique in accordance with the invention.

A conventional imaging approach is depicted in FIG. 4a, and a Talbot imaging approach is depicted schematically in FIG. 4b. In FIG. 4a the system is comprised of two four-f systems. A plane wave of coherent light first passes through a phase mask 28 located relative to a pair of thin convex lenses 30 and 32, where lens 30 is displaced from phase mask 28 by focal length $f_1$ and where lens 32 has focal length $f_2$ as described above. The lenses 30 and 32 are positioned orthogonally to the optical path 34. The image formed at Fourier plane 36 contains switched positional and angular information, which image is passed through lens 32 and propagates distance $f_2$ to the output image plane at amplitude mask 38. The image coincident on the amplitude mask 38 is then propagated distance $f_1$ to a thin convex lens 40. The image formed at Fourier plane 42 may be passed through a reflective medium, such as mirror 44 to steer the beam as is known in the art. The steered image passes through another convex lens 46 and is propagated a distance $f_2$ to the output image plane at the HMC 48.

Referring now to FIG. 4b, a Talbot imaging technique in accordance with the present invention locates the phase mask 28 relative to the amplitude mask 38 a distance T in accordance with the above formula: T=2mw/tan$\theta_m$. The phase mask is, in the illustrative embodiment, a lenslet array having a ruling line width "w" as shown in FIG. 2. The angle $\theta_m$ is represented by:

$$\theta_m = \sin^{-1}\left(\frac{[m+1/2]\lambda}{w}\right)$$

This arrangement avoids the need for separate 4-f imaging systems, as shown in FIG. 4a.

The present invention has been shown in what is considered to be the most practical and preferred embodiment. It is anticipated, however, that departures may be made therefrom and that obvious modifications will occur to persons skilled in the art.

What is claimed is:

1. In a holographic memory system having a holographic memory cell, an apparatus for using the Talbot Effect to map periodic phase structures at one plane to the input data plane in a holographic memory system, comprising:

a periodic phase structure having a periodicity of 2w for receiving light;

an amplitude data structure disposed a distance T from said periodic diffractive phase structure such that said phase structure is self-imaged in a Fresnel region of said phase structure into said amplitude data structure, wherein:

$$T = \frac{2mw}{\tan\theta_m}$$

and wherein:

$$\theta_m = \sin^{-1}\left(\frac{[m+1/2]\lambda}{w}\right)$$

when said periodic phase structure of periodicity 2w is illuminated with light at wavelength $\lambda$ and $\theta_m$ is the angle at which the light is diffracted.

2. The holographic memory apparatus recited in claim 1, wherein said periodic phase structure is a lenslet array.

3. The holographic memory apparatus recited in claim 1, further comprising a reflective element disposed in a focal plane between said phase and data structures and the holographic memory cell.

4. The holographic memory apparatus recited in claim 1, wherein said reflective element is a mirror.

5. A method of using the Talbot Effect to map periodic phase structures at one plane to the input data plane in a holographic memory system in a holographic memory system having a holographic memory cell, comprising the steps of:

(a) providing a periodic phase structure having a periodicity of 2w for receiving light;

(b) locating an amplitude data structure a distance T from said periodic phase structure such that said phase structure is self-imaged in a Fresnel region of said phase structure into said amplitude data structure, wherein:

$$T = \frac{2mw}{\tan\theta_m}$$

and wherein:

$$\theta_m = \sin^{-1}\left(\frac{[m+1/2]\lambda}{w}\right)$$

(c) illuminating said periodic phase structure of periodicity 2w with light at wavelength $\lambda$, where $\theta_m$ is the angle at which the light is diffracted.

* * * * *